(12) United States Patent
Takeuchi et al.

(10) Patent No.: US 11,863,157 B2
(45) Date of Patent: Jan. 2, 2024

(54) VIBRATOR DEVICE

(71) Applicant: SEIKO EPSON CORPORATION, Tokyo (JP)

(72) Inventors: Junichi Takeuchi, Chino (JP); Hisahiro Ito, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 386 days.

(21) Appl. No.: 17/185,174

(22) Filed: Feb. 25, 2021

(65) Prior Publication Data

US 2021/0273628 A1 Sep. 2, 2021

(30) Foreign Application Priority Data

Feb. 28, 2020 (JP) ................. 2020-033743

(51) Int. Cl.
*H03H 9/05* (2006.01)
*H03B 5/32* (2006.01)
*H03H 9/19* (2006.01)
*H03H 9/10* (2006.01)

(52) U.S. Cl.
CPC ............ *H03H 9/0552* (2013.01); *H03B 5/32* (2013.01); *H03H 9/1021* (2013.01); *H03H 9/19* (2013.01)

(58) Field of Classification Search
CPC ...... H03H 9/0552; H03H 9/19; H03H 9/1021; H03B 5/32
See application file for complete search history.

(56) References Cited

U.S. PATENT DOCUMENTS

| 9,368,397 | B2 * | 6/2016 | Suhr ................. H01L 21/76898 |
| 2012/0062332 | A1 | 3/2012 | Nagai et al. |
| 2015/0214961 | A1 | 7/2015 | Toriumi et al. |
| 2020/0058843 | A1 | 2/2020 | Mizugaki |
| 2021/0098680 | A1 * | 4/2021 | Mizugaki ............... H03B 5/362 |
| 2021/0126583 | A1 * | 4/2021 | Takeuchi ............. H03H 9/1021 |
| 2022/0052250 | A1 * | 2/2022 | Kasahara ............. H10N 30/872 |
| 2022/0052668 | A1 * | 2/2022 | Kasahara ............. H03H 9/0542 |
| 2022/0166379 | A1 * | 5/2022 | Itomi ................... H03H 9/1014 |
| 2022/0166405 | A1 * | 5/2022 | Itomi ................. H03H 9/02102 |
| 2022/0239274 | A1 * | 7/2022 | Matsuzawa .......... H03H 9/1014 |
| 2022/0239275 | A1 * | 7/2022 | Itasaka ................. H03H 9/0557 |

(Continued)

FOREIGN PATENT DOCUMENTS

| JP | 2013-219704 A | 10/2013 |
| JP | 2015-142265 | 8/2015 |

(Continued)

*Primary Examiner* — J. San Martin
(74) *Attorney, Agent, or Firm* — Rankin, Hill & Clark LLP

(57) ABSTRACT

There is provided a vibrator device including: a vibrator element; a semiconductor substrate having a first surface on which the vibrator element is disposed and a second surface positioned on an opposite side of the first surface; a fractional N-PLL circuit disposed at the second surface; a wiring that is disposed at the first surface and electrically couples the vibrator element and the fractional N-PLL circuit; and an output terminal that is disposed at the second surface side of the semiconductor substrate, is electrically coupled to the fractional N-PLL circuit, and outputs a signal from the fractional N-PLL circuit, in which the output terminal does not overlap the wiring in a plan view along a thickness direction of the semiconductor substrate.

5 Claims, 5 Drawing Sheets

(56) References Cited

U.S. PATENT DOCUMENTS

2022/0302894 A1* 9/2022 Nomura ............... H03H 9/1021
2022/0311414 A1* 9/2022 Nomura ............. H03H 9/02566

FOREIGN PATENT DOCUMENTS

| | | | |
|---|---|---|---|
| JP | 2017-38125 A | | 2/2017 |
| JP | 2017-139717 | | 8/2017 |
| JP | 2017139717 A | * | 8/2017 |
| JP | 2018-137512 A | | 8/2018 |
| JP | 2020-28095 A | | 2/2020 |
| WO | 2010/113746 A1 | | 10/2010 |

* cited by examiner

VIBRATOR DEVICE

The present application is based on, and claims priority from JP Application Serial Number 2020-033743, filed Feb. 28, 2020, the disclosure of which is hereby incorporated by reference herein in its entirety.

BACKGROUND

1. Technical Field

The present disclosure relates to a vibrator device.

2. Related Art

A piezoelectric oscillator described in JP-A-2017-139717 includes: a silicon first substrate; a circuit formed at a front surface side of the silicon first substrate and an external electrode coupled to the circuit; a vibrating element mounted at a back surface of the silicon first substrate; and a silicon second substrate bonded to the back surface of the silicon first substrate so as to cover the vibrating element. On the silicon first substrate, a through electrode that penetrates the back surface and the front surface and is electrically coupled to the circuit, and a mount electrode or a wiring resistance portion that electrically couples the through electrode and the vibrating element, are formed.

A configuration such as the piezoelectric oscillator of JP-A-2017-139717 is suitable for miniaturization. However, in the configuration such as the piezoelectric oscillator of JP-A-2017-139717, when the circuit includes an oscillation circuit and a fractional N-PLL (Phase Locked Loop) circuit, as a wiring that electrically couples the vibrating element and the oscillation circuit and a wiring that electrically couples the fractional N-PLL circuit and the output terminal that outputs the signal from the fractional N-PLL circuit become closer to each other, the magnetic connection therebetween becomes stronger, and there is a problem that phase noise or phase jitter worsen due to the effects of integer boundary spurious.

SUMMARY

A vibrator device according to the present application example of the present disclosure includes: a vibrator element; a semiconductor substrate having a first surface on which the vibrator element is disposed and a second surface positioned on an opposite side of the first surface; a fractional N-PLL circuit disposed at the second surface; a wiring that is disposed at the first surface and electrically couples the vibrator element and the fractional N-PLL circuit; and an output terminal that is disposed at the second surface side of the semiconductor substrate, is electrically coupled to the fractional N-PLL circuit, and outputs a signal from the fractional N-PLL circuit, in which the output terminal does not overlap the wiring in a plan view along a thickness direction of the semiconductor substrate.

DESCRIPTION OF EXEMPLARY EMBODIMENTS

Hereinafter, the vibrator device according to the present application example will be described in detail based on the embodiment illustrated in the attached drawings.

First Embodiment

Figure 1:
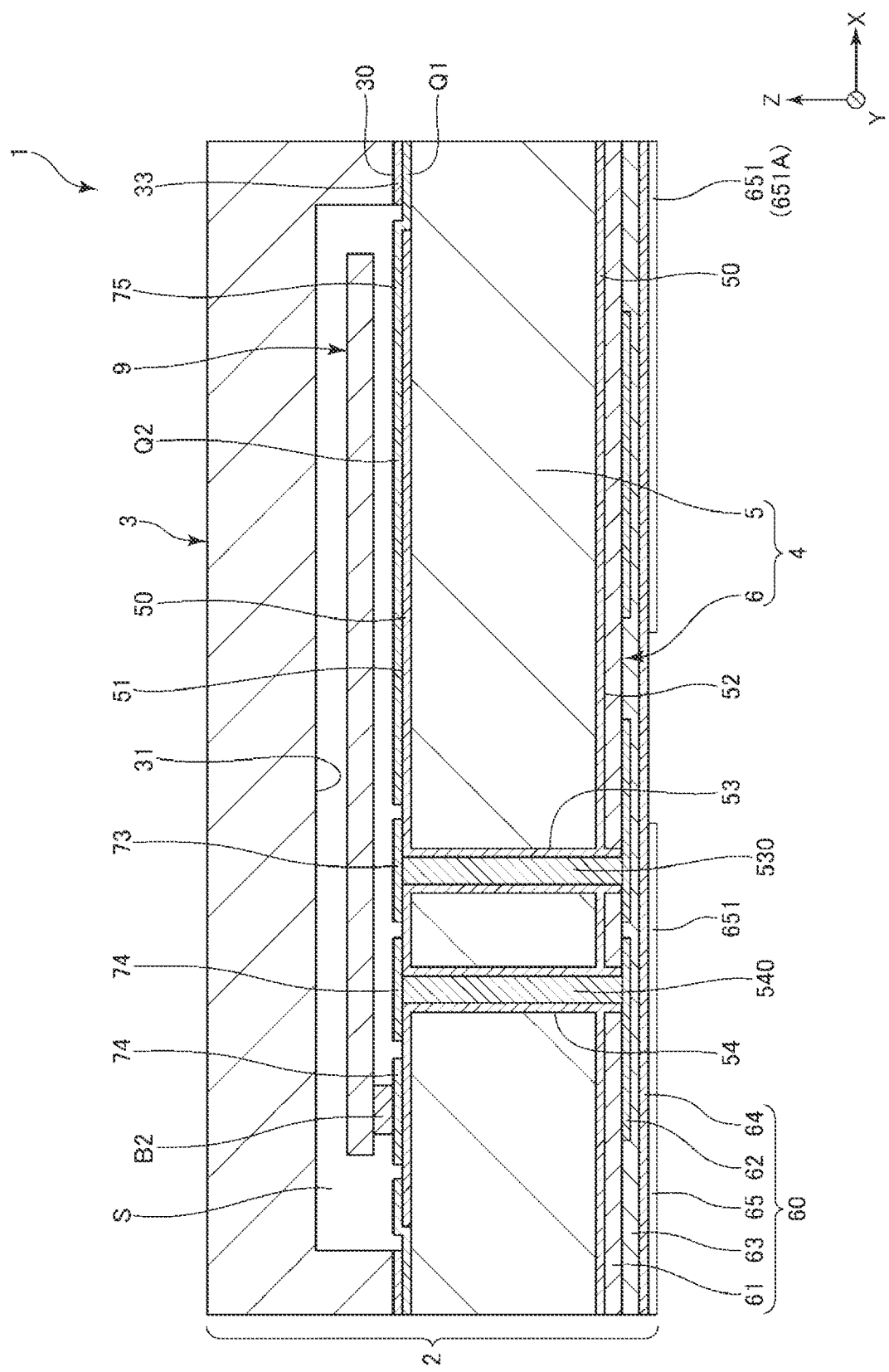
FIG. 1 is a cross-sectional view illustrating a vibrator device according to a first embodiment.
Figure 2:
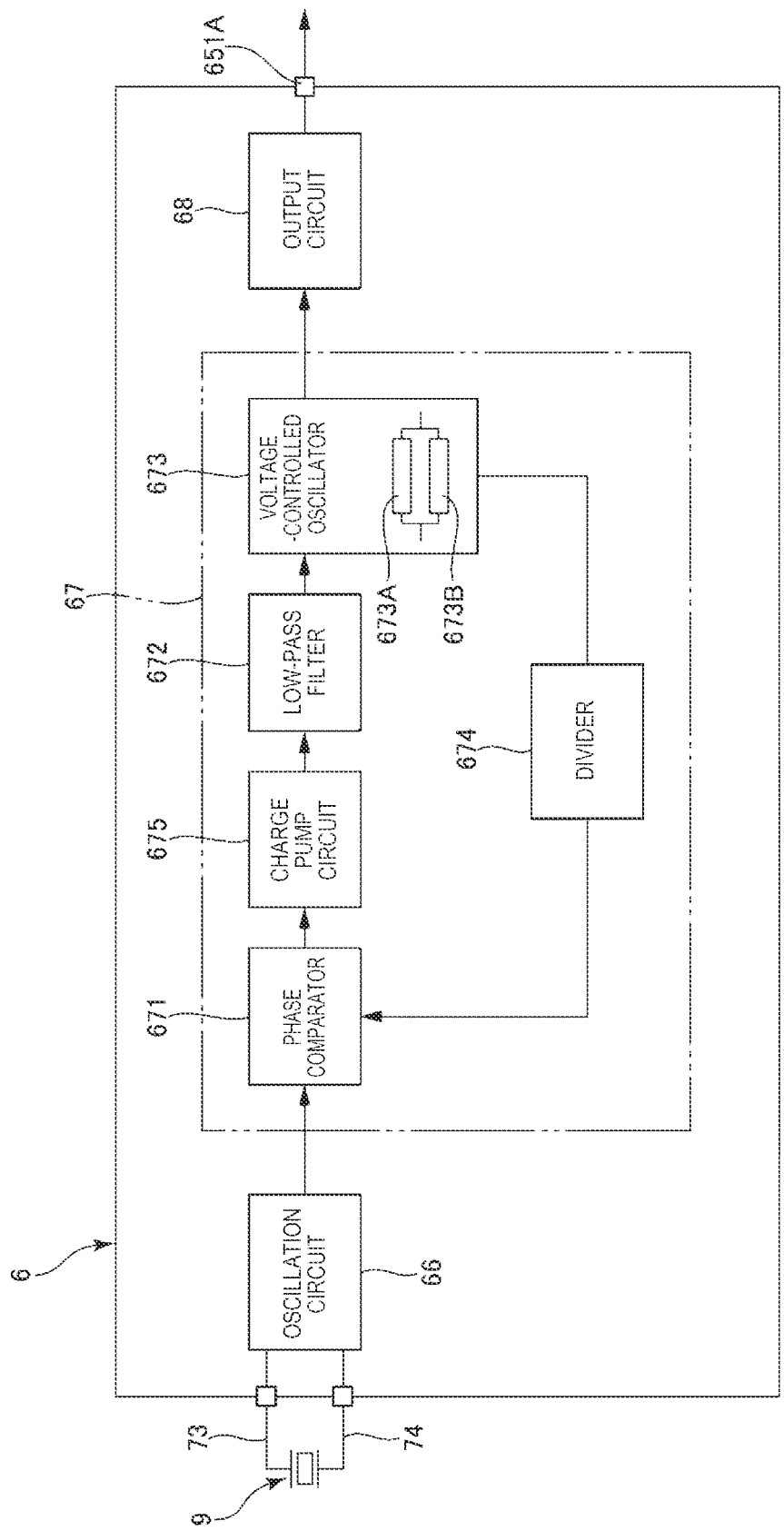
FIG. 2 is a block diagram illustrating a circuit included in the vibrator device of FIG. 1.
Figure 3:
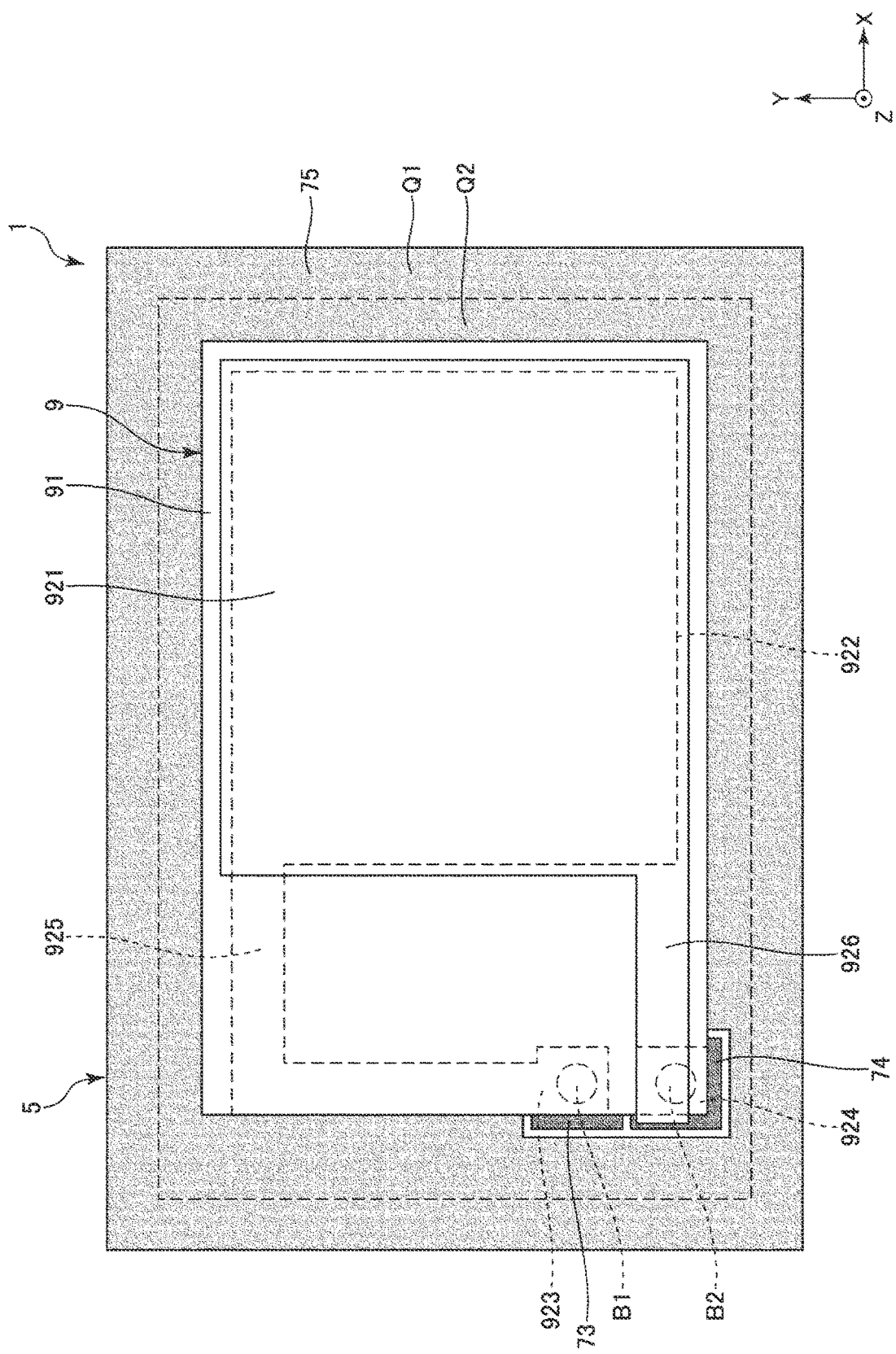
FIG. 3 is a plan view illustrating a vibrator element included in the vibrator device of FIG. 1.
Figure 4:
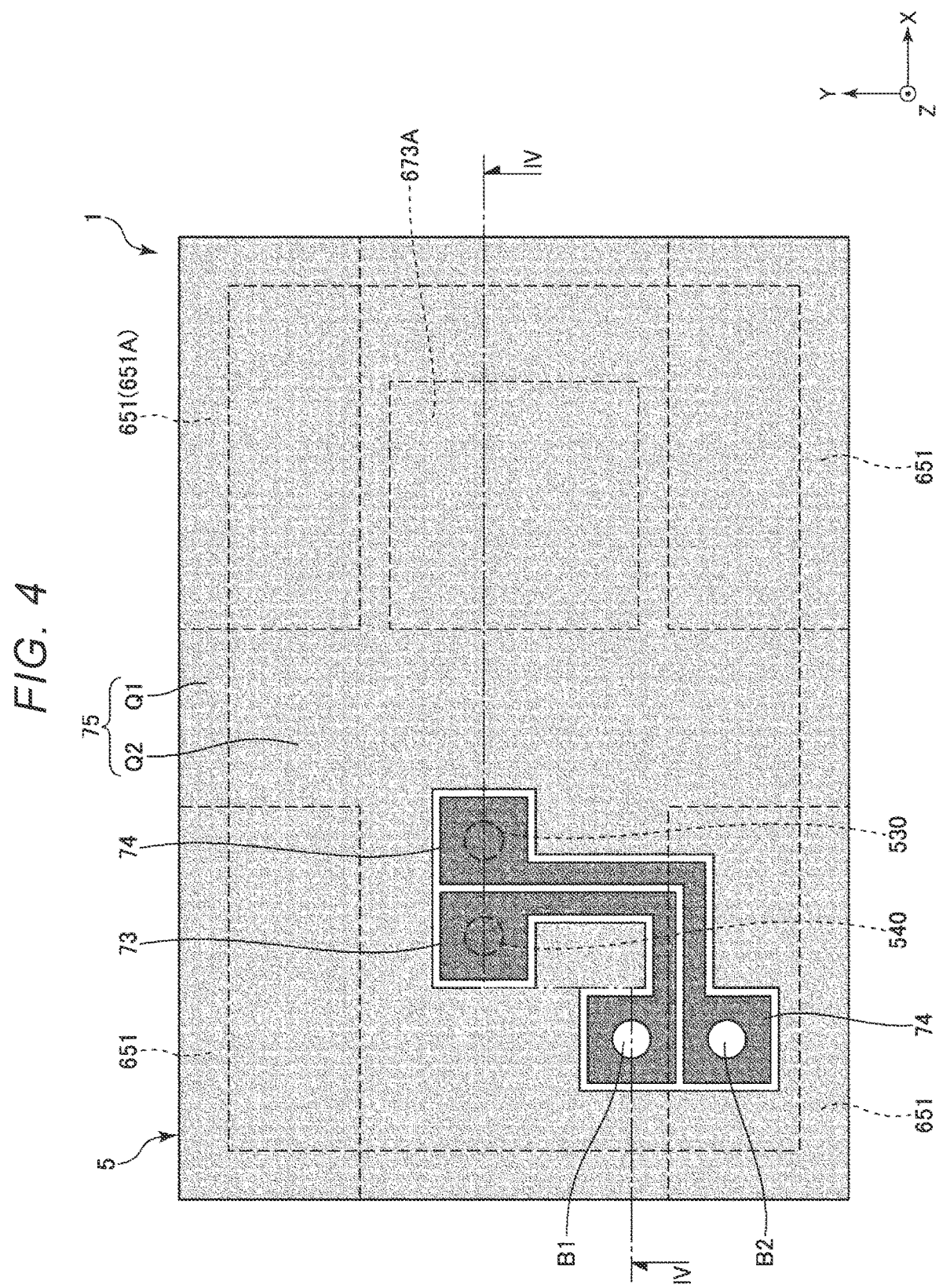
FIG. 4 is a plan view illustrating a semiconductor circuit substrate included in the vibrator device of FIG. 1.
Figure 5:
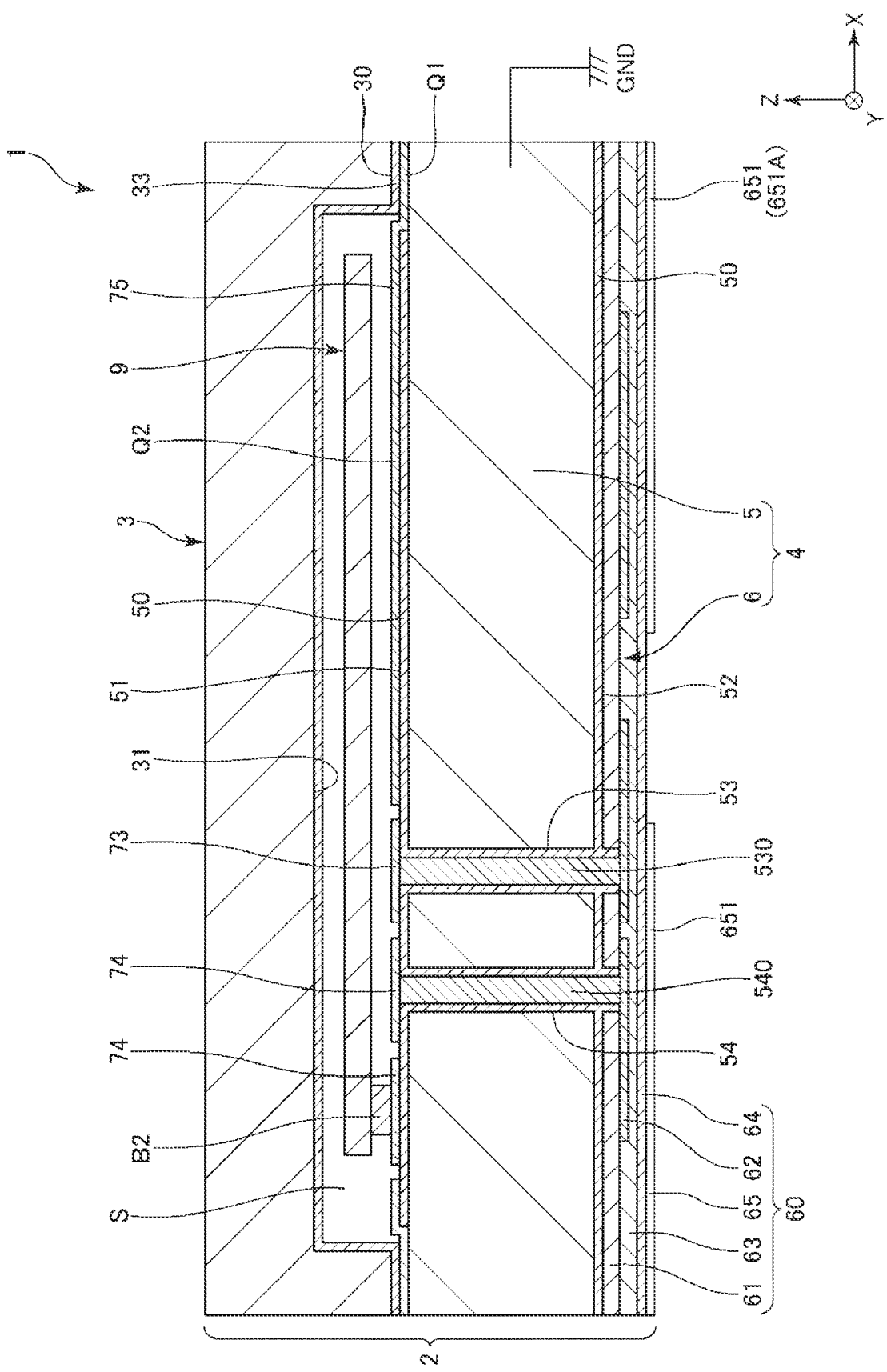
FIG. 5 is a cross-sectional view illustrating a modification example of the vibrator device of FIG. 1.

FIG. 1 is a cross-sectional view illustrating a vibrator device according to a first embodiment. FIG. 2 is a block diagram illustrating a circuit included in the vibrator device of FIG. 1. FIG. 3 is a plan view illustrating a vibrator element included in the vibrator device of FIG. 1. FIG. 4 is a plan view illustrating a semiconductor circuit substrate included in the vibrator device of FIG. 1. FIG. 5 is a cross-sectional view illustrating a modification example of the vibrator device of FIG. 1. For convenience of the description, the three axes orthogonal to each other are illustrated as the X-axis, the Y-axis, and the Z-axis in each drawing. The tip side of the arrow on the Z-axis is also referred to as "upper", and the base side is also referred to as "lower". The plan view along the thickness direction of a semiconductor substrate 5, that is, the Z-axis, is also simply referred to as "plan view". FIG. 1 is a cross-sectional view taken along the line IV-IV in FIG. 4.

A vibrator device 1 illustrated in FIG. 1 is used as an oscillator, for example, and can be incorporated in various electronic devices, moving objects, and the like. However, the vibrator device 1 may be used as a device other than the oscillator, for example, various sensors such as an acceleration sensor and an angular velocity sensor.

As illustrated in FIG. 1, the vibrator device 1 includes a package 2 having an accommodation space S inside, and a vibrator element 9 accommodated in the accommodation space S. The package 2 includes a semiconductor circuit substrate 4 as a substrate and a lid 3 bonded to the semiconductor circuit substrate 4.

Semiconductor Circuit Substrate 4

As illustrated in FIG. 1, the semiconductor circuit substrate 4 includes a semiconductor substrate 5 and a circuit 6 provided on the semiconductor substrate 5. The semiconductor substrate 5 is a silicon substrate. The semiconductor substrate 5 is a P-type silicon substrate having P-type conductivity, and the substrate potential becomes ground. However, the semiconductor substrate 5 may be a semiconductor substrate other than the silicon substrate, for example, various semiconductor substrates made of germanium, gallium arsenide, gallium arsenide phosphorus, gallium nitride, silicon carbide and the like. The semiconductor substrate 5 may be an N-type silicon substrate having N-type conductivity.

The semiconductor substrate 5 has a plate shape having an upper surface 51 as a first surface and a lower surface 52 as a second surface positioned on the opposite side of the upper surface 51. The semiconductor substrate 5 has an insulating film 50 formed on the front surface thereof. The insulating film 50 is made of silicon oxide ($SiO_2$) and is formed, for example, by thermally oxidizing the front surface of the semiconductor substrate 5. The circuit 6 electrically coupled to the vibrator element 9 is provided at the lower surface 52 of the semiconductor substrate 5. By providing the circuit 6 on the semiconductor substrate 5, the space of the semiconductor substrate 5 can be effectively utilized.

The lower surface 52 of the semiconductor substrate 5 is provided with a laminated body 60 in which an insulating layer 61, a wiring layer 62, an insulating layer 63, a passivation film 64, and a terminal layer 65 are laminated. A plurality of active elements (not illustrated) formed at the lower surface 52 are electrically coupled to each other via the wiring included in the wiring layer 62 to form the circuit 6. That is, the circuit 6 is integrally formed with the semiconductor substrate 5. A plurality of terminals 651 are formed on the terminal layer 65, and the plurality of terminals 651 include a power terminal coupled to a power source, a ground terminal coupled to the ground, a terminal to which a signal is output from the circuit 6, and the like. In particular, in the following, the terminal from which the signal from the circuit 6 is output is also referred to as an output terminal 651A. The insulating layers 61 and 63 are made of silicon oxide ($SiO_2$), and the wiring layer 62 and the terminal layer 65 are made of a conductive material, such as aluminum (Al), copper (Cu), conductive polysilicon, or tungsten (W). However, the constituent materials of each of these portions are not particularly limited.

In the illustrated configuration, the laminated body 60 includes one wiring layer 62, but the present disclosure is not limited thereto, and a plurality of wiring layers 62 may be laminated via the insulating layer 63. That is, the wiring layer 62 and the insulating layer 63 may be alternately laminated a plurality of times between the insulating layer 61 and the passivation film 64.

As illustrated in FIG. 2, the circuit 6 includes an oscillation circuit 66 that oscillates the vibrator element 9 to generate a frequency of a reference signal such as a clock signal, a fractional N-PLL circuit 67, and an output circuit 68. The oscillation circuit 66 is a circuit for oscillating the vibrator element 9 by amplifying the signal output from the vibrator element 9 and feeding the signal back to the vibrator element 9. As the circuit configured of the vibrator element 9 and the oscillation circuit 66, for example, a Pierce oscillation circuit, an inverter type oscillation circuit, a Colpitts oscillation circuit, a Hartley oscillation circuit, or the like can be used.

The fractional N-PLL circuit 67 (fractional division PLL circuit) is a PLL circuit in which a division ratio of a fraction can be set by switching the division ratio of an integer to make a division ratio of a fraction (decimal) on average. Accordingly, it is possible to output a signal of any frequency. The signal output from the fractional N-PLL circuit 67 is output from the output terminal 651A via the output circuit 68.

In particular, according to the fractional N-PLL circuit 67, the following effects can be exhibited. In a general oscillator, after accommodating the vibrator element in a package, a part of the electrode of the vibrator element is removed by laser irradiation to adjust the frequency of the vibrator element. However, in the vibrator device 1, the lid 3 is made of silicon, and after accommodating the vibrator element 9 in the package 2, it is difficult to irradiate the vibrator element 9 with a laser, and there is a case where it is difficult to adjust the frequency of the vibrator element 9. Even in such a case, when the fractional N-PLL circuit 67 is provided, it is possible to output a signal of any frequency from the circuit.

The fractional N-PLL circuit 67 includes a phase comparator 671 to which a reference frequency signal output from the oscillation circuit 66 is input, a charge pump circuit 675, a low-pass filter 672, a voltage-controlled oscillator 673 to which a DC signal from the low-pass filter 672 is input, and a divider 674 to which a frequency signal output from the voltage-controlled oscillator 673 is input, and the frequency signal divided by the divider 674 is input to the phase comparator 671. The phase comparator 671 detects a phase difference between the reference frequency signal and the divided frequency signal, and outputs the detection result as a pulse voltage to the charge pump circuit 675. The charge pump circuit 675 converts the pulse voltage output by the phase comparator 671 into a current, and outputs the current to the low-pass filter 672. The low-pass filter 672 removes a high-frequency component from the output signal from the charge pump circuit 675, converts the signal into a voltage, and outputs the voltage as a DC signal for controlling the voltage-controlled oscillator 673. The divider 674 can realize fractional division by switching the division ratio of an integer to make a division ratio of a fraction on a time average. The voltage-controlled oscillator 673 uses an LC oscillation circuit including an inductor 673A and a capacitor 673B.

As illustrated in FIG. 1, the semiconductor substrate 5 is formed with a pair of through holes 53 and 54 that penetrate the semiconductor substrate 5 in the thickness direction. The through holes 53 and 54 are filled with a conductive material, and accordingly, through electrodes 530 and 540 are formed. As illustrated in FIGS. 1, 3 and 4, the upper surface 51 of the semiconductor substrate 5 is provided with a pair of wirings 73 and 74 electrically coupled to the vibrator element 9. The wiring 73 is electrically coupled to the circuit 6 via the through electrode 530, and the wiring 74 is electrically coupled to the circuit 6 via the through electrode 540.

As illustrated in FIGS. 1, 3 and 4, at the upper surface 51 of the semiconductor substrate 5, a bonding layer 75 as a metal layer used for bonding to the lid 3 is provided. The bonding layer 75 includes: a frame-shaped bonding region Q1 which is provided along the outer edge of the semiconductor substrate 5, and is used for bonding to the lid 3; and a non-bonding region Q2 which is positioned on the inside of the bonding region Q1, and faces the accommodation space S. The bonding layer 75 is insulated from the wirings 73 and 74, and the non-bonding region Q2 is provided as wide as possible at the upper surface 51 as long as the non-bonding region Q2 is not in contact with the wirings 73 and 74.

As illustrated in FIG. 1, at the part that overlaps the bonding region Q1, the insulating film 50 is removed from the upper surface 51, and the bonding layer 75 is electrically coupled to the silicon substrate part of the semiconductor substrate 5. Accordingly, the bonding layer 75 is coupled to the ground similarly to the semiconductor substrate 5. Therefore, the bonding layer 75, particularly the non-bonding region Q2, can function as a shield layer that suppresses magnetic connection between the respective portions in the vibrator device 1. This effect will be described later.

The bonding layer 75 is collectively formed by the same process as that of the wirings 73 and 74. Specifically, for example, a metal film is formed at the upper surface 51 of the semiconductor substrate 5 by sputtering, and the metal film is patterned by using a photolithography technique and an etching technique, and thereby the wirings 73 and 74 and the bonding layer 75 can be formed collectively. Accordingly, it becomes easy to form the semiconductor circuit substrate 4. The configurations of the wirings 73 and 74 and the bonding layer 75 are not particularly limited, but can be, for example, a laminated body including an underlayer made of titanium (Ti), tungsten (W), a titanium/tungsten alloy, or the like, and a coating layer made of gold (Au). Accordingly, the wirings 73 and 74 and the bonding layer 75 having excellent adhesion to the semiconductor substrate 5 and electrical conductivity are obtained.

The configuration of the bonding layer 75 is not particularly limited, and the non-bonding region Q2 may be omitted. The bonding region Q1 and the non-bonding region Q2 may be formed separately.

The semiconductor circuit substrate 4 having such a configuration is provided with the wirings 73 and 74 at the upper surface 51 side of the semiconductor substrate 5 and the output terminal 651A at the lower surface 52 side. Therefore, the wirings 73 and 74 and the output terminal 651A can be separated from each other as much as possible on the semiconductor circuit substrate 4, and the electromagnetic connection therebetween can be effectively suppressed. Therefore, it is not easily affected by integer boundary spurious, and phase noise or phase jitter can be effectively suppressed in the circuit 6. In particular, in the present embodiment, the semiconductor substrate 5 is configured of a P-type silicon substrate and is electrically coupled to the ground terminal. Accordingly, the semiconductor substrate 5 is coupled to the ground when the vibrator device 1 is driven. Therefore, the semiconductor substrate 5 positioned between the wirings 73 and 74 and the output terminal 651A functions as a shield layer, and the electromagnetic connection between the wirings 73 and 74 and the output terminal 651A can be more effectively suppressed.

In a plan view, the wirings 73 and 74 and the output terminal 651A are provided so as not to overlap each other. Accordingly, the wirings 73 and 74 and the output terminal 651A can be separated from each other as much as possible on the semiconductor circuit substrate 4, and the electromagnetic connection therebetween can be more effectively suppressed. Therefore, it is not easily affected by integer boundary spurious, and phase noise or phase jitter can be more effectively suppressed in the circuit 6. In particular, in the present embodiment, since the circuit 6 is provided on the semiconductor substrate 5, the electrical path between the vibrator element 9 and the circuit 6 can be shortened more than that when an integrated circuit (IC) separate from the substrate on which the vibrator element 9 is disposed is used as the circuit, and it is also possible to shorten the wiring length of the output terminal 651A. Therefore, the electromagnetic connection between the wirings 73 and 74 and the output terminal 651A can be suppressed more effectively.

In a plan view, the inductor 673A included in the fractional N-PLL circuit 67 and the wirings 73 and 74 are configured so as not to overlap each other. Accordingly, the wirings 73 and 74 and the inductor 673A can be separated from each other as much as possible on the semiconductor circuit substrate 4, and the electromagnetic connection therebetween can be effectively suppressed. Therefore, it is not easily affected by integer boundary spurious, and phase noise or phase jitter can be effectively suppressed in the circuit 6. However, the present disclosure is not limited thereto, and the inductor 673A and the wirings 73 and 74 may overlap each other in a plan view.

In a plan view, the inductor 673A included in the fractional N-PLL circuit 67 and the output terminal 651A are configured so as not to overlap each other. Accordingly, the output terminal 651A and the inductor 673A can be separated from each other as much as possible on the semiconductor circuit substrate 4, and the electromagnetic connection therebetween can be effectively suppressed. Therefore, it is not easily affected by integer boundary spurious, and phase noise or phase jitter can be effectively suppressed in the circuit 6. However, the present disclosure is not limited thereto, and the inductor 673A and the output terminal 651A may overlap each other in a plan view.

As described above, at the upper surface 51 of the semiconductor substrate 5, the bonding layer 75 coupled to the ground is provided. The bonding layer 75 is disposed close to the wirings 73 and 74, and further, is positioned between the output terminal 651A and the vibrator element 9. Therefore, the bonding layer 75 can effectively suppress the magnetic connection between the wirings 73 and 74 and the output terminal 651A and the magnetic connection between the vibrator element 9 and the output terminal 651A. In the present embodiment, the bonding layer 75 overlaps the inductor 673A in a plan view along the Z-axis. Therefore, the bonding layer 75 and the inductor 673A are likely to be disposed close to each other, and there is a concern that an eddy current is generated to reduce the inductance value or increase the loss (Q value).

Therefore, in the present embodiment, the circuit 6 is provided at the lower surface 52 side of the semiconductor substrate 5 to maintain a sufficiently large separation distance between the bonding layer 75 and the inductor 673A. Accordingly, the influence of the eddy current can be suppressed to be smaller than that when the circuit 6 is provided on the upper surface 51. The inductor 673A is built in the wiring layer 62 included in the circuit 6. In the present embodiment, the wiring layer 62 is one layer, but as described above, when there are a plurality of wiring layers 62, it is preferable that the inductor 673A is formed in at least the lowest layer, that is, the wiring layer 62 other than the wiring layer 62 on the semiconductor substrate 5 side, preferably, in the wiring layer 62 positioned on a side closest to the surface layer, that is, distal to the semiconductor substrate 5. Accordingly, a larger separation distance between the inductor 673A and the bonding layer 75 can be secured, and the above-described effect becomes more remarkable.

Since the semiconductor substrate 5 is also coupled to the ground, there is a case where an eddy current is generated similarly to the bonding layer 75 to reduce the inductance value or increase the loss. Therefore, by forming the semiconductor substrate 5 with a high-resistance silicon substrate, the influence of the eddy current can be suppressed to be small.

Vibrator Element 9

As illustrated in FIG. 3, the vibrator element 9 has a vibration substrate 91 and an electrode disposed at the front surface of the vibration substrate 91. The vibration substrate 91 has a thickness sliding vibration mode, and is formed of an AT cut quartz crystal substrate in the present embodiment. Since the AT cut quartz crystal substrate has a third-order frequency-temperature characteristic, the AT cut quartz crystal substrate becomes the vibrator element 9 having an excellent temperature characteristic. The electrode includes an excitation electrode 921 disposed at the upper surface of the vibration substrate 91, an excitation electrode 922 disposed at the lower surface facing the excitation electrode 921, one pair of terminals 923 and 924 disposed at the lower surface of the vibration substrate 91, a wiring 925 that electrically couples the terminal 923 and the excitation electrode 922, and a wiring 926 that electrically couples the terminal 924 and the excitation electrode 921.

The configuration of the vibrator element 9 is not limited to the above-described configuration. For example, the vibrator element 9 may have a mesa type in which the vibration region sandwiched between the excitation electrodes 921 and 922 protrudes from the surroundings, or conversely, the vibrator element 9 may have an inverted mesa type in which the vibration region is recessed from the surroundings. Bevel processing for grinding the surroundings of the vibration substrate 91 and convex processing for making the upper surface and the lower surface convex curved surfaces may be performed.

The vibrator element 9 is not limited to one that vibrates in the thickness sliding vibration mode, and may be, for example, a vibrator element in which a plurality of vibrating arms perform flexural vibration in the in-plane direction. That is, the vibration substrate 91 is not limited to the one formed of the AT cut quartz crystal substrate, and may be formed of a quartz crystal substrate other than the AT cut quartz crystal substrate, for example, an X cut quartz crystal substrate, a Y cut quartz crystal substrate, a Z cut quartz crystal substrate, a BT cut quartz crystal substrate, an SC cut quartz crystal substrate, an ST cut quartz crystal substrate, or the like. In the present embodiment, the vibration substrate 91 is made of quartz crystal, but the present disclosure is not limited thereto, and may be formed of, for example, a piezoelectric single crystal such as lithium niobate, lithium tantalate, lithium tetraborate, langasite crystal, potassium niobate, or gallium phosphate, and may be formed of a piezoelectric single crystal other than these. Furthermore, the vibrator element 9 is not limited to the piezoelectric drive type vibrator element, and may be an electrostatic drive type vibrator element that uses electrostatic force.

As illustrated in FIG. 3, the vibrator element 9 is fixed to the pair of wirings 73 and 74 by conductive bonding members B1 and B2. The bonding member B1 electrically couples the wiring 73 and the terminal 923, and the bonding member B2 electrically couples the wiring 74 and the terminal 924. Accordingly, the vibrator element 9 and the circuit 6 are electrically coupled.

The bonding members B1 and B2 are not particularly limited as long as the bonding members have both conductivity and bondability, and for example, various metal bumps such as gold bumps, silver bumps, copper bumps, or solder bumps, and a conductive adhesive or the like in which a conductive filler such as a silver filler is dispersed in various adhesives such as polyimide-based, epoxy-based, silicone-based, or acrylic-based adhesive can be used. When the former metal bumps are used as the bonding members B1 and B2, the generation of gas from the bonding members B1 and B2 can be suppressed, and the environmental change of the accommodation space S, particularly the increase in pressure, can be effectively suppressed. Meanwhile, when the latter conductive adhesive is used as the bonding members B1 and B2, the bonding members B1 and B2 are softer than the metal bumps, and stress is less likely to be transmitted from the package 2 to the vibrator element 9.

Lid 3

Similar to the semiconductor substrate 5, the lid 3 is a silicon substrate. Accordingly, the linear expansion coefficients of the semiconductor substrate 5 and the lid 3 become equal, the generation of thermal stress due to thermal expansion is suppressed, and the vibrator device 1 having an excellent vibration characteristic is obtained. Since the vibrator device 1 can be formed by a semiconductor process, the vibrator device 1 can be manufactured with high accuracy and can be miniaturized. However, the lid 3 is not particularly limited, and may be a semiconductor substrate other than silicon, for example, a semiconductor substrate formed of germanium, gallium arsenide, gallium arsenide phosphorus, gallium nitride, silicon carbide and the like.

As illustrated in FIG. 1, the lid 3 has a bottomed recess portion 31 which is open to a lower surface 30 thereof and accommodates the vibrator element 9 inside. The lid 3 is bonded to the upper surface 51 of the semiconductor substrate 5 at the lower surface 30. Accordingly, the accommodation space S for accommodating the vibrator element 9 is formed between the lid 3 and the semiconductor substrate 5. The accommodation space S is airtight and is in a reduced pressure state, preferably a state closer to vacuum. Accordingly, the oscillation characteristics of the vibrator element 9 are improved. However, the atmosphere of the accommodation space S is not particularly limited, and may be, for example, an atmosphere in which an inert gas such as nitrogen or Ar is sealed, and may be in an atmospheric pressure state or a pressurized state instead of a reduced pressure state.

As illustrated in FIG. 1, a bonding layer 33 is provided at the lower surface 30 of the lid 3. The lid 3 and the semiconductor substrate 5 are bonded to each other by bonding the bonding layer 33 and the bonding layer 75 provided at the upper surface 51 of the semiconductor substrate 5. In the present embodiment, the semiconductor substrate 5 and the lid 3 are bonded to each other by using diffusion bonding that uses diffusion between metals among bonding methods. However, the method of bonding the semiconductor substrate 5 and the lid 3 is not particularly limited. The configuration of the bonding layer 33 is not particularly limited, but can be the same as that of the bonding layer 75.

The lid 3 is electrically coupled to the semiconductor substrate 5 via the bonding layers 75 and 33. That is, the lid 3 is coupled to the same potential, that is, ground, as that of the semiconductor substrate 5 when the vibrator device 1 is driven. Accordingly, the lid 3 functions as a shield layer that shields disturbance, and noise can be suppressed from being mixed into the vibrator element 9. However, the present disclosure is not limited thereto, the lid 3 may not have to be electrically coupled to the semiconductor substrate 5.

The configuration of the bonding layer 33 provided on the lid 3 is not particularly limited, and for example, as illustrated in FIG. 5, the configuration may be provided at the inner surface of the recess portion 31. Accordingly, the bonding layer 33 functions as a shield layer together with the lid 3.

The vibrator device 1 has been described above. As described above, the vibrator device 1 includes: the vibrator element 9; the semiconductor substrate 5 having the upper surface 51 as a first surface on which the vibrator element 9 is disposed and the lower surface 52 as a second surface positioned on an opposite side of the upper surface 51; the fractional N-PLL circuit 67 disposed at the lower surface 52; the wirings 73 and 74 that are disposed at the upper surface 51 and electrically couple the vibrator element 9 and the fractional N-PLL circuit 67; and the output terminal 651A that is disposed at the lower surface 52 side of the semiconductor substrate 5, is electrically coupled to the fractional N-PLL circuit 67, and outputs a signal from the fractional N-PLL circuit 67. Then, the output terminal 651A does not overlap the wirings 73 and 74 in a plan view along the thickness direction of the semiconductor substrate 5, that is, along the Z-axis.

Accordingly, the wirings 73 and 74 and the output terminal 651A can be separated from each other as much as possible on the semiconductor circuit substrate 4. Therefore, as compared with a case where the wirings 73 and 74 and the output terminal 651A overlap each other in a plan view, these electromagnetic connections can be suppressed more effectively. Therefore, it is not easily affected by integer boundary spurious, and phase noise or phase jitter can be more effectively suppressed in the circuit 6.

As described above, the vibrator device 1 further includes: the terminal 651 as a ground terminal coupled to a ground, and the semiconductor substrate 5 is electrically coupled to the ground terminal, and has the bonding layer 75 as a metal layer that is disposed at the upper surface 51 and electrically coupled to the semiconductor substrate 5. Accordingly, the bonding layer 75 can effectively suppress the magnetic connection between the wirings 73 and 74 and the output terminal 651A and the magnetic connection between the vibrator element 9 and the output terminal 651A.

As described above, the vibrator device 1 has the lid 3 bonded to the upper surface 51 of the semiconductor substrate 5 so as to cover the vibrator element 9. The lid 3 is electrically coupled to the semiconductor substrate 5. Accordingly, the lid 3 functions as a shield layer that shields disturbance, and noise can be suppressed from being mixed into the vibrator element 9.

As described above, the fractional N-PLL circuit 67 has the voltage-controlled oscillator 673 as an oscillator including the inductor 673A. In a plan view, the output terminal 651A does not overlap the inductor 673A. Accordingly, the output terminal 651A and the inductor 673A can be separated from each other as much as possible on the semiconductor circuit substrate 4, and the electromagnetic connection therebetween can be effectively suppressed. Therefore, it is not easily affected by integer boundary spurious, and phase noise or phase jitter can be effectively suppressed in the circuit 6.

As described above, in a plan view, the wirings 73 and 74 do not overlap the inductor 673A. Accordingly, the wirings 73 and 74 and the inductor 673A can be separated from each other as much as possible on the semiconductor circuit substrate 4, and the electromagnetic connection therebetween can be effectively suppressed. Therefore, it is not easily affected by integer boundary spurious, and phase noise or phase jitter can be effectively suppressed in the circuit 6.

Although the vibrator device of the present disclosure has been described above based on the illustrated embodiment, the present disclosure is not limited thereto, and the configuration of each portion can be any configuration having the same function. Any other components may be added to the present disclosure. Moreover, each embodiment may be combined with each other suitably.

In the above-described embodiment, the vibrator device 1 is applied to the oscillator, but the present disclosure is not limited thereto. For example, by using the vibrator element 9 as a physical quantity sensor element capable of detecting an angular velocity or acceleration, the vibrator device 1 can be applied to various physical quantity sensors such as an angular velocity sensor or an acceleration sensor.

In the above-described embodiment, the lid 3 has the recess portion 31, but the lid 3 is not limited thereto. For example, the semiconductor substrate 5 of the semiconductor circuit substrate 4 may have a bottomed recess portion that opens at the upper surface 51, and the lid 3 may have a flat plate shape. In this case, the vibrator element 9 may be fixed to the bottom surface of the recess portion of the semiconductor substrate 5.

What is claimed is:

1. A vibrator device comprising:
   a vibrator element;
   a semiconductor substrate having a first surface on which the vibrator element is disposed and a second surface positioned on an opposite side of the first surface;
   a fractional N-PLL circuit disposed at the second surface;
   a wiring that is disposed at the first surface and electrically couples the vibrator element and the fractional N-PLL circuit; and
   an output terminal that is disposed at the second surface side of the semiconductor substrate, is electrically coupled to the fractional N-PLL circuit, and outputs a signal from the fractional N-PLL circuit, wherein
   the output terminal does not overlap the wiring in a plan view along a thickness direction of the semiconductor substrate.

2. The vibrator device according to claim 1, further comprising:
   a ground terminal, wherein
   the semiconductor substrate is electrically coupled to the ground terminal, and
   a metal layer that is disposed at the first surface and electrically coupled to the semiconductor substrate is provided.

3. The vibrator device according to claim 1, further comprising:
   a lid bonded to the first surface of the semiconductor substrate so as to cover the vibrator element, wherein
   the lid is electrically coupled to the semiconductor substrate.

4. The vibrator device according to claim 1, wherein
   the fractional N-PLL circuit has an oscillator with an inductor, and
   the output terminal does not overlap the inductor in the plan view.

5. The vibrator device according to claim 4, wherein the wiring does not overlap the inductor in the plan view.

* * * * *